United States Patent
Jian et al.

(10) Patent No.: US 10,879,081 B2
(45) Date of Patent: Dec. 29, 2020

(54) METHODS OF REDUCING OR ELIMINATING DEFECTS IN TUNGSTEN FILM

(71) Applicant: APPLIED MATERIALS, INC., Santa Clara, CA (US)

(72) Inventors: Guoqiang Jian, San Jose, CA (US); Wei Tang, Santa Clara, CA (US); Chi-Chou Lin, San Jose, CA (US); Paul F. Ma, Santa Clara, CA (US); Kai Wu, Palo Alto, CA (US); Vikash Banthia, Mountain View, CA (US); Mei Chang, Saratoga, CA (US); Jia Ye, San Jose, CA (US); Wenyu Zhang, San Jose, CA (US); Jing Zhou, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/196,056

(22) Filed: Nov. 20, 2018

(65) Prior Publication Data
US 2019/0157102 A1   May 23, 2019

Related U.S. Application Data

(60) Provisional application No. 62/590,053, filed on Nov. 22, 2017.

(51) Int. Cl.
*H01L 21/321* (2006.01)
*H01L 21/768* (2006.01)
*H01L 21/285* (2006.01)

(52) U.S. Cl.
CPC ...... *H01L 21/321* (2013.01); *H01L 21/28556* (2013.01); *H01L 21/28568* (2013.01); *H01L 21/7685* (2013.01); *H01L 21/76877* (2013.01)

(58) Field of Classification Search
None
See application file for complete search history.

(56) References Cited

U.S. PATENT DOCUMENTS 6,482,740 B2   11/2002  Soininen et al.
6,727,169 B1 *  4/2004  Raaijmakers ....... C23C 16/0272
                                          438/622

(Continued)

FOREIGN PATENT DOCUMENTS

KR   10-2008-0060633 A   7/2008

OTHER PUBLICATIONS

International Search Report and Written Opinion dated Mar. 8, 2019 for PCT Application No. PCT/US2018/061929.

*Primary Examiner* — Ali Naraghi
(74) *Attorney, Agent, or Firm* — Moser Taboada

(57) ABSTRACT

Methods and apparatus for reducing and eliminating defects in tungsten film are disclosed herein. In the present disclosure, reducing or eliminating oxidation of a first surface of a tungsten film having a predetermined first thickness disposed upon a substrate and within a plurality of trenches is disclosed. The plurality of trenches include a predetermined depth, and a width of less than 20 nanometers. The predetermined first thickness of the tungsten film is substantially uniform throughout the plurality of trenches such that the predetermined first thickness of the tungsten film does not substantially change to a second thickness when the first surface is contacted with air or oxygen.

20 Claims, 4 Drawing Sheets

(56) References Cited

U.S. PATENT DOCUMENTS

| | | | |
|---|---|---|---|
| 2006/0216932 A1* | 9/2006 | Kumar | H01L 21/7681 |
| | | | 438/641 |
| 2014/0138602 A1 | 5/2014 | Miller et al. | |
| 2015/0050807 A1 | 2/2015 | Wu et al. | |
| 2015/0294975 A1* | 10/2015 | Nakata | H01L 27/10885 |
| | | | 257/334 |
| 2016/0322493 A1 | 3/2016 | Wang et al. | |
| 2018/0138123 A1* | 5/2018 | Liang | H01L 23/5283 |

* cited by examiner

400

┌─────────────────────────────────────┐
│ DEPOSITING A TUNGSTEN FILM HAVING A FIRST │
│ SURFACE AND A PREDETERMINED FIRST │
│ THICKNESS UPON A SUBSTRATE AND WITHIN A │
│ PLURALITY OF TRENCHES, WHEREIN THE │
│ PLURALITY OF TRENCHES COMPRISE A │
│ PREDETERMINED DEPTH, AND A WIDTH OF LESS │ — 402
│ THAN 20 NANOMETERS, AND WHEREIN THE │
│ PREDETERMINED FIRST THICKNESS IS │
│ SUBSTANTIALLY UNIFORM THROUGHOUT THE │
│ PLURALITY OF TRENCHES SUCH THAT THE │
│ PREDETERMINED FIRST THICKNESS DOES NOT │
│ SUBSTANTIALLY CHANGE TO A SECOND │
│ THICKNESS WHEN THE FIRST SURFACE IS │
│ CONTACTED WITH OXYGEN │
└─────────────────────────────────────┘

┌─────────────────────────────────────┐
│ DEPOSITING A TUNGSTEN FILM HAVING A FIRST │
│ SURFACE AND A PREDETERMINED FIRST │
│ THICKNESS UPON A SUBSTRATE AND WITHIN A │
│ PLURALITY OF TRENCHES, WHEREIN THE │ — 502
│ PLURALITY OF TRENCHES COMPRISE A │
│ PREDETERMINED DEPTH, AND A WIDTH OF LESS │
│ THAN 20 NANOMETERS │
└─────────────────────────────────────┘
                  ↓
┌─────────────────────────────────────┐
│ CONTACTING THE FIRST SURFACE WITH A │ — 504
│ HALIDE TYPE METAL PRECURSOR │
└─────────────────────────────────────┘
                  ↓
┌─────────────────────────────────────┐
│ CONTACTING THE FIRST SURFACE WITH │
│ OXYGEN, WHEREIN THE PREDETERMINED FIRST │
│ THICKNESS DOES NOT SUBSTANTIALLY CHANGE │ — 506
│ TO A SECOND THICKNESS UPON CONTACT WITH │
│ OXYGEN │
└─────────────────────────────────────┘

FIG. 5

METHODS OF REDUCING OR ELIMINATING DEFECTS IN TUNGSTEN FILM

CROSS-REFERENCE TO RELATED APPLICATIONS

This application claims benefit of U.S. provisional patent application Ser. No. 62/590,053, filed Nov. 22, 2017 which is herein incorporated by reference in its entirety.

FIELD

Embodiments of the disclosure generally relate to the processing of semiconductor substrates. More particularly, embodiments of the disclosure relate to deposition of tungsten layers on semiconductor substrates using vapor deposition techniques.

BACKGROUND

The semiconductor processing industry continues to strive for larger production yields while increasing the uniformity of layers deposited on substrates. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that includes precise control of the substrate temperature and the precursors introduced into the processing chamber in order to produce a desired layer of uniform thickness. These process parameters become more critical as feature size, such as trenches and vias decrease, creating a need for more complexity in maintaining uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

The inventors have found that depositing tungsten by conventional CVD and ALD methods, however, has several disadvantages. For example, defects are the primary device killers formed during semiconductor device manufacturing leading to device yield loss. As semiconductor devices features shrink to sub-20 nanometer regime, the inventors have observed new defects in logic metal gate and contact, NAND, and other memory structures. In tungsten related vapor deposition process (ALD and CVD), a type of defect is found in small trenches e.g. trenches having a width less than 20 nanometers. For example, silky-like defects may form in the lower portion of the feature or trench including $WO_x$ (in embodiments x is an integer such as 1-3) defects formed after tungsten or tungsten film, such as those formed from organic based process(es), are contacted with or exposed to air or oxygen. The defect appears as a silky-like deposit or residue that may deform the conformity of the layer or appear as a deposit reducing the depth of the feature or trench compared to other features without the defect. The defects, such as silky-like defects, may not be typically observed in larger trenches, e.g. trenches having a width greater than 20 nanometers. Such defects are problematic to continued processing such as deposition, patterning, and the like. For example, use of tungsten frustrates the manufacturing process as defects on the lower surface of a narrow trench impede the ability to uniformly deposit additional layers or films thereon as needed. Moreover, the inventors have found that the silky-like defects are unpredictable and difficult to monitor and control.

Accordingly, the inventors have provided improved methods of depositing tungsten and tungsten containing layers.

SUMMARY

Methods and apparatus for deposition of tungsten layers on semiconductor substrates using vapor deposition techniques are provided herein. In some embodiments, a method for reducing or eliminating defects in tungsten film, includes: reducing or eliminating oxidation of a first surface of a tungsten film having a predetermined first thickness disposed upon a substrate and within a plurality of trenches, wherein the plurality of trenches comprise a predetermined depth, and a width of less than 20 nanometers, and wherein the predetermined first thickness is substantially uniform throughout the plurality of trenches such that the predetermined first thickness does not substantially change to a second thickness when the first surface is contacted with oxygen.

In some embodiments, a method of depositing a tungsten film, includes: depositing a tungsten film having a first surface and a predetermined first thickness upon a substrate and within a plurality of trenches, wherein the plurality of trenches include a predetermined depth, and a width of less than 20 nanometers, and wherein the predetermined first thickness is substantially uniform throughout the plurality of trenches such that the predetermined first thickness does not substantially change to a second thickness when the first surface is contacted with oxygen.

A method of reducing or eliminating defects in tungsten film, includes: depositing a tungsten film having a first surface and a predetermined first thickness upon a substrate and within a plurality of trenches, wherein the plurality of trenches include a predetermined depth, and a width of less than 20 nanometers; contacting the first surface with a halide type metal precursor; and contacting the first surface with oxygen, wherein the predetermined first thickness is substantially uniform throughout the plurality of trenches such that the predetermined first thickness does not substantially change to a second thickness upon contact with oxygen.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 4 is a flow diagram of a method of depositing a tungsten film in accordance with one embodiment of the present disclosure.

FIG. 5 is a flow diagram of a method of reducing or eliminating defects in tungsten film in accordance with one embodiment of the present disclosure.

Figure 1:
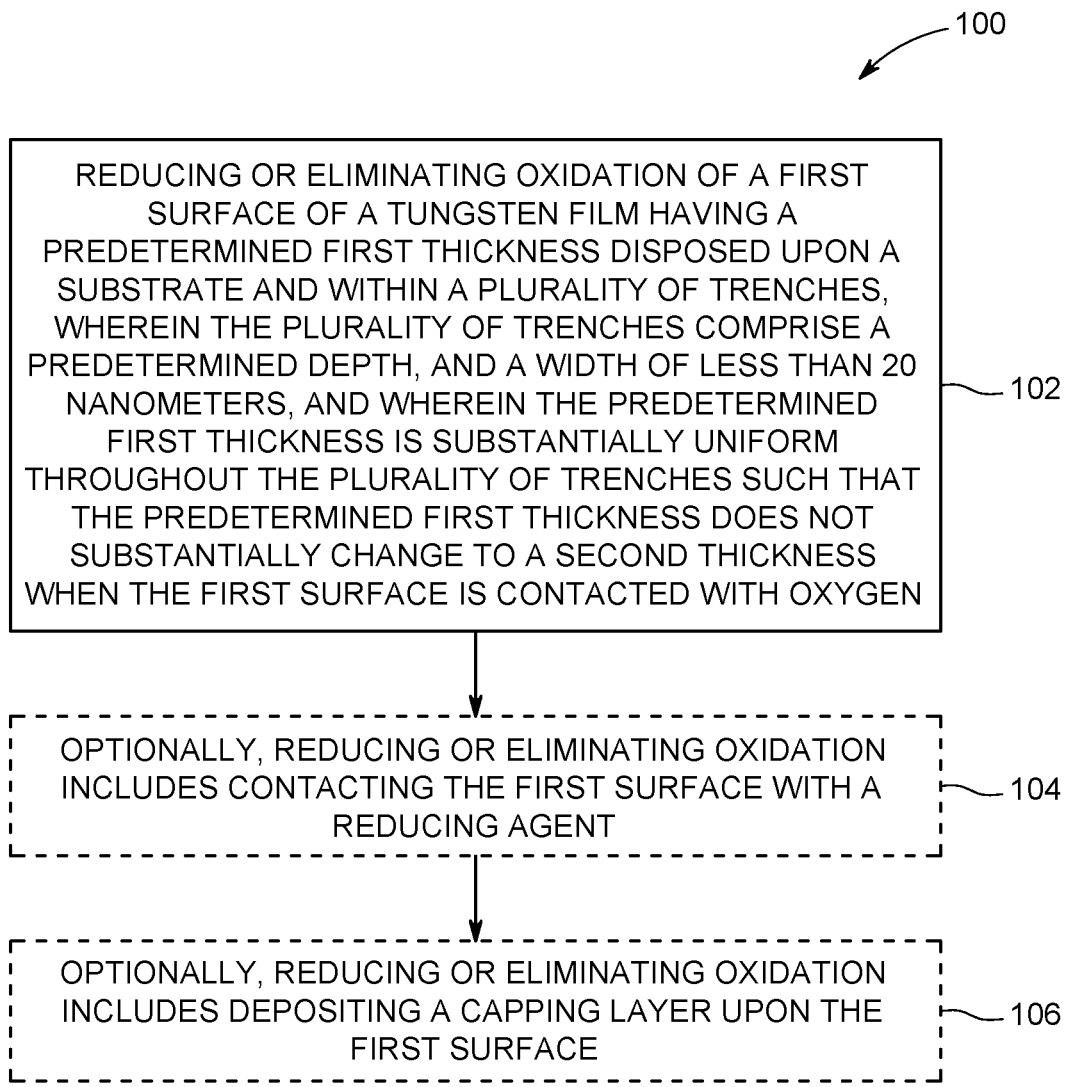
FIG. 1 depicts a flow diagram of reducing or eliminating defects in tungsten film in accordance with embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide methods of reducing or eliminating defects in tungsten film. While not intended to be limiting of the disclosure, embodiments of the present disclosure are useful when depositing tungsten in one or more trenches having a width of 20 nanometers or below.

The inventors have observed that by reducing or eliminating oxidation of tungsten after deposition by CVD and ALD, defects that form in one or more trenches having a width of 20 nanometers or less can advantageously be reduced or eliminated. Reducing or eliminating defects in the completed tungsten layer leads to device yield increase, reduced manufacturing costs, and an increase in uniformity across a plurality of features during the formation of a semiconductor device. Increased uniformity enhances application of additional process layers as manufacturing continues. The inventors have also found that methods in accordance with the present disclosure advantageously reduce or eliminate the formation of silky-like or WOx defects when ALD and CVD are employed under different process conditions. Thus, embodiments of the present disclosure may advantageously be used during different CVD and ALD processes. In some embodiments, methods of the present disclosure advantageously provide tungsten films having significantly improved surface uniformity and production level throughput. In embodiments, high quality control is maintained upon tungsten film contact with air and oxygen.

Figure 2A:
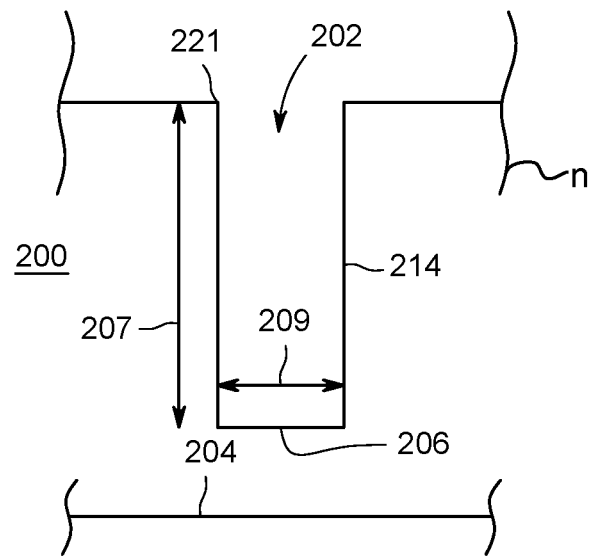
FIGS. 2A-2C respectively depict stages of fabrication of depositing a tungsten film in accordance with embodiments of the present disclosure.
Figure 2B:
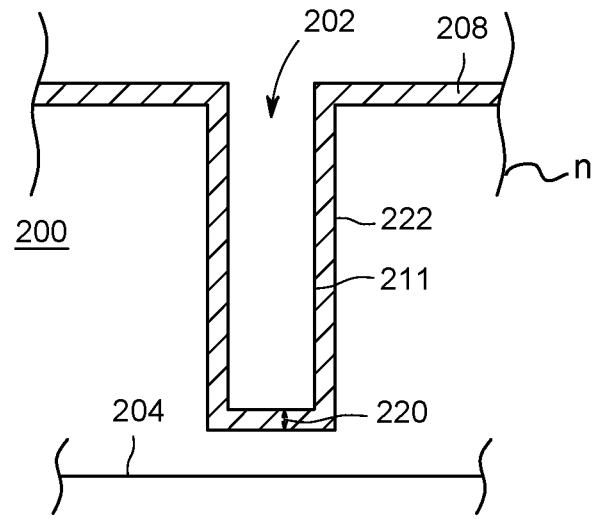
Figure 2C:
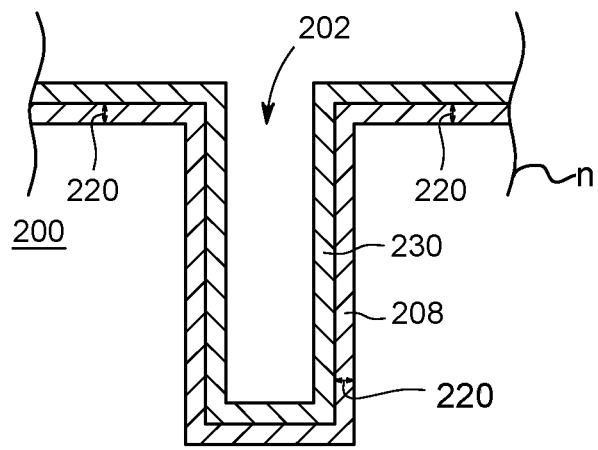

FIG. 1 is a flow diagram of a method 100 for reducing or eliminating defects in tungsten film in accordance with some embodiments of the present disclosure. The method 100 is described below with respect to the stages of depositing a tungsten film as depicted in FIGS. 2A-2C and may be performed, for example, in a suitable cluster tool and process chambers. Exemplary processing systems that may be used to perform the methods disclosed herein may include, but are not limited to, any of the ENDURA®, CENTURA®, or PRODUCER® brand processing systems, commercially available from Applied Materials, Inc., of Santa Clara, Calif. Non-limiting examples of suitable cluster tools and process chambers are disclosed in commonly-owned U.S. Pat. No. 7,405,158 entitled Methods for depositing tungsten layers employing atomic layer deposition techniques, issued Jul. 29, 2008 to Lai et al. Other process chambers, including the process chamber of FIG. 3, and ones available from other manufacturers, may also be suitably used in connection with the teachings provided herein.

Figure 3:
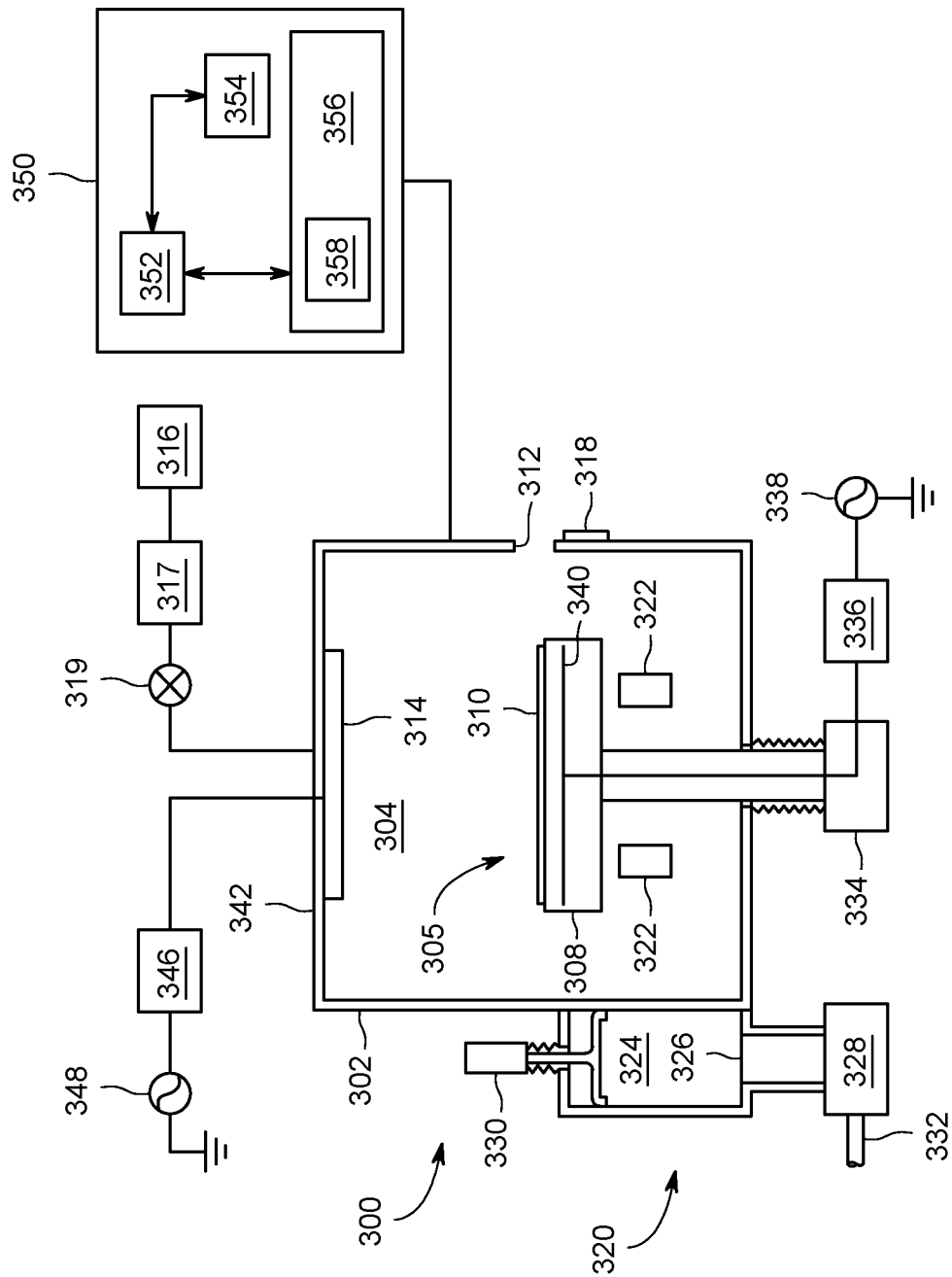
FIG. 3 is a process chamber suitable for performing a deposition process in accordance with some embodiments of the present disclosure.

The method 100 is typically performed on a substrate 200 provided to a processing volume of a process chamber (e.g. inner volume 305 of the process chamber 302 of FIG. 3). In some embodiments, as shown in FIG. 2A, the substrate 200 includes one or more features such as trench 202 (one shown in FIGS. 2A-C) to be filled with a tungsten layer 208 of the substrate 200, trench 202 extending towards a base 204 of the substrate 200. Although the following description is made with respect to one feature, the substrate 200 may include any number of features (such as a plurality of trenches 202, vias or the like) as described below. For example, referring to FIG. 2A, n refers to an integer representing a number of trenches 202 in substrate 200. In embodiments, n may be 1 or more than 1 representing a plurality of trenches 202 in the substrate 200. For example, if n=5, FIG. 2A would be representative of five trenches such as trench 202 in a single substrate 200.

The substrate 200 may be any suitable substrate having the trench 202 formed in the substrate 200. For example, the substrate 200 may include one or more of silicon (Si), silicon oxide ($SiO_2$), or the like. In embodiments, the substrate 200 may include trench 202 formed in a dielectric layer. For example, a low-k material (e.g., a material having a dielectric constant less than silicon oxide, or less than about 3.9), or the like. In addition, the substrate 200 may include additional layers of materials or may have one or more completed or partially completed structures or devices formed in or on the substrate 200 (not shown). In embodiments, the substrate 200 may be, for example, a doped or undoped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer.

The substrate 200 is not limited to any particular size or shape. The substrate can be a round wafer having a 200 mm diameter, a 300 mm diameter or other diameters, such as 450 mm, among others. The substrate can also be any polygonal, square, rectangular, curved or otherwise non-circular workpiece, such as a polygonal glass substrate used in the fabrication of flat panel displays.

The trench 202, or a plurality of trenches or features may be formed by etching the substrate 200 using any suitable etch process. In some embodiments, the trench 202 is defined by one or more sidewalls 214, a bottom surface 206 and upper corners 221. In some embodiments, the trench 202 may have a high aspect ratio, e.g., an aspect ratio between about of about 5:1 and about 20:1. As used herein, the aspect ratio is the ratio of a depth of the feature to a width of the feature. In embodiments, the trench 202 has a width 209 less than or equal to 20 nanometers, less than or equal to 10 nanometers, or a width 209 between 5 to 10 nanometers, between 5 to 15 nanometers, or between 1 and 20 nanometers. In embodiments, width 209 is approximately 4, 5, 6, 7, 8, 9, 10, 11, 12, 13, 14, 15, 16, 17, 18, or 19 nanometers.

Referring to FIG. 2A-C, an underlayer (not shown) may optionally be deposited on substrate 200 and within trench 202 in a process chamber (e.g. process chamber 302 of FIG. 3) configured to deposit a layer. The underlayer can be a layer conformably formed along at least a portion of the sidewalls 214 and/or bottom surface 206 of a feature such as trench 202 such that a substantial portion of the feature prior to the deposition of the layer remains unfilled after deposition of the layer. In some embodiments, the underlayer may be formed along the entirety of the sidewalls 214 and bottom surface 206 of the trench 202. The underlayer may be a wetting layer provided to enhance the adherence of a metal layer disposed upon the underlayer.

Referring to FIG. 2B, a tungsten layer 208 is shown deposited atop the substrate 200 and within the trench 202. In embodiments, tungsten layer 208 includes tungsten or a tungsten alloy. The tungsten layer 208 may also include, however, other metals, metal alloys, and dopants, such as nickel, tin, titanium, tantalum, molybdenum, platinum, iron, niobium, palladium, nickel cobalt alloys, doped cobalt, and combinations thereof. In embodiments, the tungsten and tungsten-containing material is substantially pure tungsten, or tungsten with no more than 5% impurities. In embodiments, the tungsten layer 208 is a tungsten film or tungsten-containing film resulting from a CVD and/or ALD processing and may include a pure tungsten (W), tungsten nitride (WN), tungsten carbide (WC), tungsten carbonitride (WCN), tungsten silicide ($W_kSi_l$), or tungsten oxide ($W_nO_m$) film, wherein k, l, m, and n are integers which inclusively range from 1 to 6. In embodiments, the tungsten films may include nitride metals containing tungsten, or tungsten metals containing N or C. In embodiments, the tungsten layer 208 includes a nitride containing tungsten product. Non-limiting examples of suitable nitride containing tungsten product for use herein includes a tungsten nitride film (WN film), tungsten carbonitride film (WCN film), or tungsten nitride of a high nitrogen concentration (WNy, y>0.1). In embodiments, suitable tungsten film for use in accordance with the present disclosure includes tungsten, tungsten nitride of a low nitrogen concentration (WNx, 0<x≤0.1), tungsten carbide of a low carbon concentration (WCx, 0<x≤0.10), tungsten carbide of a high carbon concentration (WCy, y>0.1), tungsten carbonitride of any carbon and nitrogen concentration (WCN).

In some embodiments, as shown in FIG. 2B, the tungsten layer 208 is deposited atop a surface 222 of the substrate 200 and within the trench 202 formed in the surface 222. In embodiments, the tungsten layer 208 is deposited within a plurality of trenches on the surface of the substrate. The tungsten layer 208 may be deposited using any suitable ALD and/or CVD deposition process(es). Non-limiting examples of CVD processes suitable for deposition of the tungsten layer 208 are disclosed in commonly-owned U.S. Pat. No. 7,405,158 entitled Methods for depositing tungsten layers employing atomic layer deposition techniques, issued Jul. 29, 2008 to Lai et al. In some embodiments, the tungsten layer 208 is deposited via a CVD process using suitable tungsten precursors for forming tungsten-containing materials including ALD process(es) described in commonly-owned U.S. Pat. No. 7,405,158 entitled Methods for depositing tungsten layers employing atomic layer deposition techniques, issued Jul. 29, 2008 to Lai et al. under the process conditions disclosed therein. Suitable process conditions for depositing tungsten layer 208 include process conditions, such as temperature suitable to heat the substrate at a temperature in the range from about 100° C. to about 600° C., or in the range from about 200° C. to about 500° C., or in the range from about 300° C. to about 450° C. In embodiments, the process chamber is maintained at a pressure in the range from about 1 Torr to about 150 Torr, or in the range from about 5 Torr to about 90 Torr.

In some embodiments, the thickness of the tungsten layer 208 is predetermined such as about 20 angstroms to about 150 angstroms, or about 50 angstroms to about 150 angstroms. In some embodiments, the thickness of the tungsten layer 208 is predetermined such as about 5 angstroms to about 1000 angstroms, or about 10 angstroms to about 500 angstroms, or about 10, 20, 30, 40, 50, 60, 70, 80, 90, or 100 angstroms. In embodiments, the shape of the first tungsten layer 208 is substantially uniform and conformal as generally shown in FIG. 2B. However, the inventors have observed problematic variation may occur and oxidized material such as silky-defects may form in trench 202 proximate the bottom of trench 202 upon contact with air and oxygen. As explained above, silky-like defects may form in the lower portion, such as lower half, or lower third of the feature or trench including WOx (wherein x is an integer) defects formed after tungsten or tungsten film, such as those formed from organic based process(es), are contacted with or exposed to air or oxygen. The defects may appear as a silky-like deposit or residue that may deform the conformity of the layer or appear as a deposit reducing the depth of the feature or trench compared to other features without the defect. The defects, such as silky-like defects, may not be typically observed in larger trenches, e.g. trenches having a width greater than 20 nanometers. Such defects are problematic to continued processing such as deposition, patterning, and the like. As described herein, embodiments of the present disclosure reduce or eliminate the defects and ensure that tungsten layer 208 remains substantially uniform and conformal after contact with air and/or oxygen. For example, in embodiments tungsten layer 208 has a predetermined first thickness and is substantially uniform throughout a single trench and/or a plurality of trenches such that the predetermined first thickness does not substantially change to a second thickness when the first surface is contacted with oxygen.

Referring to FIG. 1, 2A-B, embodiments of the present disclosure include a method 100 of reducing or eliminating defects in tungsten film, including at 102: reducing or eliminating oxidation of a first surface 211 of a tungsten layer 208 such as film having a predetermined first thickness 220 disposed upon a substrate 200 and within a plurality of trenches 202. In embodiments, the plurality of trenches (n) is an integer such as 1 or more representing a plurality of trenches in substrate 200. In embodiments, the plurality of trenches 202 may include a predetermined depth 207, and a width 209 of less than 20 nanometers. In embodiments, the predetermined first thickness 220 of tungsten layer 208 is substantially uniform throughout the plurality of trenches 202 such that the predetermined first thickness 220 does not substantially change to a second thickness when the first surface 211 is contacted with oxygen. For example, in embodiments, the predetermined first thickness 220 of tungsten layer 208 may be measured and determined to be substantially uniform throughout the plurality of trenches 202 such that the predetermined first thickness 220 does not substantially change to a second thickness when the first surface 211 is contacted with oxygen. In one example, the predetermined first thickness 220 (shown as an arrow in tungsten layer 208) is about 150 angstroms, and remains substantially uniform (about 150 angstroms) throughout a plurality of trenches 202 such that the predetermined first thickness 220 does not substantially change to a second thickness when the first surface 211 is contacted with oxygen.

Referring to FIG. 1, method 100 may include at 104 reducing or eliminating oxidation by contacting the first surface 211 with a reducing agent. In embodiments, at 104, the first surface 211 is exposed to a soak process lasting in a range from about 1 second to about 90 seconds, such as 30 to 60 seconds, or around 60 seconds. In embodiments, the soak process occurs under the same or substantially similar process condition, such as temperature and pressure of the CVD or ALD process that deposited the tungsten layer. A pulse of a reductant or reducing compound accompanied with a suitable carrier gas is introduced into the process chamber. The reducing gas may be the same compound as the gas used for the soak process or alternatively, the reducing gas may be a different compound, depending on the product throughput requirements and the device applications. For example, in embodiments, where the first surface 211 is tungsten film including a nitride containing tungsten product, suitable reducing agent may include a halide type metal precursor to provide a metal halide at the first surface 211. Non-limiting examples of suitable halide type metal precursor includes at least one of $TiCl_4$, $TaCl_4$, and combinations thereof. In other embodiments, where the first surface 211 is tungsten film including nitride such as a tungsten nitride film (WN film), tungsten carbonitride film (WCN film), or tungsten nitride of a high nitrogen concentration ($WN_y$, y>0.1) suitable reducing agent may include a silane precursor, such as $SiH_4$. In embodiments, a silane precursor may be suitable wherein the tungsten film includes tungsten, tungsten nitride of a low nitrogen concentration ($WN_x$, 0<x≤0.1), tungsten carbide of a low carbon concentration ($WC_x$, 0<x≤0.10), tungsten carbide of a high carbon concentration ($WC_y$, y>0.1), tungsten carbonitride of any carbon and nitrogen concentration (WCN).

A pulse of purge gas may be introduced into the processing chamber to purge or otherwise remove any residual reducing compound.

Referring now to FIG. 2C and method 100 at 106, optionally, first surface 211 may include a capping layer 230 disposed thereon to reduce or eliminate oxidation of tungsten layer 208. In embodiments, the shape of the capping layer 230 is substantially uniform and conformal as generally shown in FIG. 2C. In embodiments, the capping layer 230 has a conformal nature and does not completely fill the feature or trench. Accordingly, the capping layer 230 may be shaped to accommodate additional layers disposed atop the capping layer top surface. Suitable capping layers 230 may contain a metal or metal nitride material that includes titanium, titanium nitride, titanium silicon nitride, tantalum, tantalum nitride (TaN), tantalum silicon nitride, and combinations thereof. In embodiments, capping layer includes at least one of TiN, TaN, TiSiN, TiAlC, and combinations thereof. A capping layer 230 may be formed by process techniques such as chemical vapor deposition (CVD), atomic layer deposition (ALD), physical vapor deposition (PVD), derivatives thereof and combinations thereof. The capping layer 230 may be deposited to a thickness of at least about 30 angstroms, such as in a range from about 30 angstroms to about 200 angstroms. In one example, a capping layer 230 is deposited on the first surface 211 by an ALD process by using TiN. In another example, a capping layer 230 is deposited on the first surface 211 by an ALD process by using TaN. In another example, a capping layer 230 is deposited on the first surface 211 by an ALD process by using TiSiN. In another example, a capping layer 230 is deposited on the first surface 211 by an ALD process by using TiAlC.

In embodiments, the capping layer 230 may be plasma densified prior to performing a subsequent fabrication process.

FIG. 3 depicts a schematic diagram of an illustrative apparatus of the kind that may be used to practice embodiments of the disclosure as discussed herein. The apparatus 300 may comprise a controller 350 and a process chamber 302 having an exhaust system 320 for removing excess process gases, processing by-products, or the like, from the inner volume 305 of the process chamber 302. Exemplary process chambers may include any of several process chambers configured for thermal decomposition reactions, atomic layer deposition (ALD), or chemical vapor deposition (CVD), available from Applied Materials, Inc. of Santa Clara, Calif. Other suitable process chambers from other manufacturers may similarly be used.

The process chamber 302 has an inner volume 305 that may include a processing volume 304. The processing volume 304 may be defined, for example, between a substrate support 308 disposed within the process chamber 302 for supporting a substrate 310 thereupon during processing and one or more gas inlets, such as a showerhead 314 and/or nozzles provided at predetermined locations. In some embodiments, the substrate support 308 may include a mechanism that retains or supports the substrate 310 on the surface of the substrate support 308, such as an electrostatic chuck, a vacuum chuck, a substrate retaining clamp, or the like (not shown). In some embodiments, the substrate support 308 may include mechanisms for controlling the substrate temperature such as heating and/or cooling devices (not shown), and/or for controlling the species flux and/or ion energy proximate the substrate surface. In embodiments, the process chamber 302 may be an oxygen-free process chamber. In embodiments, substrate support 308 may be include a filament 340, heating mechanism 336 and power source 338 sufficient to heat the substrate and facilitate tungsten precursor deposition in accordance with the present disclosure.

In some embodiments, the substrate support 308 may include an RF bias electrode (not shown). The RF bias electrode may be coupled to one or more bias power sources (one bias power source not shown) through one or more respective matching networks (matching network shown). The one or more bias power sources may be capable of producing up to 1200 W or RF energy at a frequency of about 2 MHz to about 60 MHz, such as at about 2 MHz, or about 13.56 MHz, or about 60 Mhz. In some embodiments, two bias power sources may be provided for coupling RF power through respective matching networks to the RF bias electrode at respective frequencies of about 2 MHz and about 13.56 MHz. The at least one bias power source may provide either continuous or pulsed power. In some embodiments, the bias power source alternatively may be a DC or pulsed DC source.

The substrate 310 may enter the process chamber 302 via an opening 312 in a wall of the process chamber 302. The opening 312 may be selectively sealed via a slit valve 318, or other mechanism for selectively providing access to the interior of the chamber through the opening 312. The substrate support 308 may be coupled to a lift mechanism 334 that may control the position of the substrate support 308 between a lower position (as shown) suitable for transferring substrates into and out of the chamber via the opening 312 and a selectable upper position suitable for processing. The process position may be selected to maximize process uniformity for a particular process. When in at least one of the elevated processing positions, the substrate support 308 may be disposed above the opening 312 to provide a symmetrical processing region.

The one or more gas inlets (e.g., the showerhead 314) may be coupled to a gas supply 316 for providing one or more process gases through a mass flow controller 317 into the processing volume 304 of the process chamber 302. In addition, one or more valves 319 may be provided to control the flow of the one or more process gases. The mass flow controller 317 and one or more valves 319 may be used individually, or in conjunction to provide the process gases at predetermined flow rates at a constant flow rate, or pulsed.

Although a showerhead 314 is shown in FIG. 3, additional or alternative gas inlets may be provided such as nozzles or inlets disposed in the ceiling or on the sidewalls of the process chamber 302 or at other locations suitable for providing gases to the process chamber 302, such as the base of the process chamber, the periphery of the substrate support, or the like.

The apparatus 300 may utilize capacitively coupled RF energy for plasma processing. For example, the process chamber 302 may have a ceiling 342 made from dielectric materials and a showerhead 314 that is at least partially conductive to provide an RF electrode (or a separate RF electrode may be provided). The showerhead 314 (or other RF electrode) may be coupled to one or more RF power sources (one RF power source 348 shown) through one or more respective matching networks (matching network 346 shown). The one or more plasma sources may be capable of producing up to about 3,000 W, or in some embodiments, up to about 5,000 W, of RF energy at a frequency of about 2 MHz and/or about 13.56 MHz or a high frequency, such as 27 MHz and/or 60 MHz. The exhaust system 320 generally includes a pumping plenum 324 and one or more conduits that couple the pumping plenum 324 to the inner volume 305 (and generally, the processing volume 304) of the process chamber 302.

A vacuum pump 328 may be coupled to the pumping plenum 324 via a pumping port 326 for pumping out the exhaust gases from the process chamber via one or more exhaust ports (two exhaust ports 322 shown). The vacuum pump 328 may be fluidly coupled to an exhaust outlet 332 for routing the exhaust to appropriate exhaust handling equipment. A valve 330 (such as a gate valve, or the like) may be disposed in the pumping plenum 324 to facilitate control of the flow rate of the exhaust gases in combination with the operation of the vacuum pump 328.

To facilitate control of the process chamber 302 as described above, the controller 350 may be any form of general-purpose computer processor that can be used in an industrial setting for controlling various chambers and subprocessors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The methods disclosed herein may generally be stored in the memory 356 as a software routine 358 that, when executed by the CPU 352, causes the process chamber 302 to perform processes of the present disclosure. The software routine 358 may also be stored and/or executed by a second CPU (not shown) that is remotely located from the hardware being controlled by the CPU 352. Some or all of the method of the present disclosure may also be performed in hardware. As such, the disclosure may be implemented in software and executed using a computer system, in hardware as, e.g., an application specific integrated circuit or other type of hardware implementation, or as a combination of software and hardware. The software routine 358 may be executed after the substrate 310 is positioned on the substrate support 308. The software routine 358, when executed by the CPU 352, transforms the general purpose computer into a specific purpose computer (controller 150) that controls the chamber operation such that the methods disclosed herein are performed.

Referring now to FIG. 4, a flow diagram of a method 400 of depositing a tungsten film in accordance with one embodiment of the present disclosure is shown. At process sequence 402, the method includes depositing a tungsten film having a first surface and a predetermined first thickness upon a substrate and within a plurality of trenches, wherein the plurality of trenches include a predetermined depth, and a width of less than 20 nanometers, and wherein the predetermined first thickness is substantially uniform throughout the plurality of trenches such that the predetermined first thickness does not substantially change to a second thickness when the first surface is contacted with oxygen. In embodiments, depositing a tungsten film further includes contacting the first surface with a reducing agent. In embodiments, the reducing agent is halide type metal precursor to provide a metal halide at the first surface (such as $TiCl_4$, $TaCl_4$, and combinations thereof) or a silane precursor such as a silane precursor comprising, consisting essentially of, or consisting of $SiH_4$. In embodiments, the reducing agent is $TiCl_4$, $TaCl_4$, or combinations thereof contacted with the substrate in an amount sufficient to reduce the substrate and/or prevent the formation of silky defects as described herein, or the formation of the tungsten layer with varied, non-uniform thickness. In some embodiments, the tungsten film includes nitride containing tungsten products. In some embodiments, depositing a tungsten film further includes depositing a capping layer upon the first surface.

Referring now to FIG. 5, a flow diagram of a method 500 of reducing or eliminating defects in tungsten film is provided. In embodiments, method 500 includes at 502 depositing a tungsten film having a first surface and a predetermined first thickness upon a substrate and within a plurality of trenches, wherein the plurality of trenches includes a predetermined depth, and a width of less than 20 nanometers. At 504, method 500 includes contacting the first surface with a halide type metal precursor. At 506, method 500 includes contacting the first surface with oxygen, wherein the predetermined first thickness does not substantially change to a second thickness upon contact with oxygen. In embodiments, the halide type metal precursor is one of $TiCl_4$, $TaCl_4$, or combinations thereof. In embodiments, the halide type metal precursor is provided to an inner volume of a process chamber in an amount sufficient to react with the first surface to reduce the first surface and/or prevent the formation of silky defects as described herein on the first surface, or prevent the formation of the tungsten layer with varied, non-uniform thickness upon contact with oxygen.

In embodiments, the tungsten film comprises a nitride containing tungsten product, for example, the nitride containing tungsten product may comprise, consist essentially of, or consist of a tungsten nitride film (WN film), tungsten carbonitride film (WCN film), or tungsten nitride of a high nitrogen concentration ($WN_y$, $y>0.1$).

In some embodiments, the tungsten film comprises, consists essentially of, or consists of tungsten, tungsten nitride of a low nitrogen concentration ($WN_x$, $0<x\leq0.1$), tungsten carbide of a low carbon concentration ($WC_x$, $0<x\leq0.10$), tungsten carbide of a high carbon concentration (WCy, y>0.1), tungsten carbonitride of any carbon and nitrogen concentration (WCN).

In other embodiments, of the present disclosure a method of depositing a tungsten film, includes: depositing a tungsten film having a first surface and a predetermined first thickness upon a substrate and within a plurality of features, wherein the plurality of features comprise a predetermined depth, and a width of less than 20 nanometers, and wherein the predetermined first thickness does not substantially change to a second thickness when the first surface is contacted with oxygen. In embodiments, the predetermined first thickness is substantially uniform throughout the plurality of features such that the predetermined first thickness does not substantially change to a second thickness when the first surface is contacted with oxygen.

In other embodiments of the present disclosure a method of depositing a tungsten film includes depositing a tungsten film having a first surface and a predetermined first thickness upon a substrate and within a plurality of features, wherein the plurality of features include a predetermined depth, and a width of less than 20 nanometers; and reducing or eliminating oxidation of a first surface of a tungsten film by contacting the first surface with a halide type metal precursor, silane, or capping layer as described herein. In embodiments, the method includes contacting the first surface with oxygen, wherein the predetermined first thickness does not substantially change to a second thickness upon contact with oxygen.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure. While the foregoing is directed to embodiments of the present disclosure, other and further embodiments of the disclosure may be devised without departing from the basic scope thereof.

The invention claimed is:

1. A method of fabrication on a substrate, comprising:
reducing or eliminating oxidation of a fully-formed tungsten-containing metal film comprising contacting the provided metal film with a reducing agent, the metal film having a predetermined first thickness disposed upon a substrate and within a plurality of trenches, wherein the plurality of trenches comprise a predetermined depth, and a width of less than 20 nanometers, and wherein the predetermined first thickness is substantially uniform throughout the plurality of trenches such that the predetermined first thickness does not substantially change to a second thickness when the first surface is contacted with oxygen.

2. The method of claim 1, wherein the plurality of trenches comprises trenches with, an aspect ratio, depth to width, between about of about 5:1 and about 20:1.

3. The method of claim 1, wherein the reducing agent is halide type metal precursor to provide a metal halide at a surface of the metal layer.

4. The method of claim 3, wherein the halide type metal precursor is at least one of $TiCl_4$, $TaCl_4$, and combinations thereof.

5. The method of claim 3, wherein the tungsten-containing metal film comprises a nitride containing tungsten product.

6. The method of claim 5, wherein the nitride containing tungsten product comprises tungsten nitride (WN film), tungsten carbonitride (WCN film), or tungsten nitride of a high nitrogen concentration (WNy, y>0.1).

7. The method of claim 1, wherein the reducing agent is a silane precursor.

8. The method of claim 7, wherein the silane precursor comprises $SiH_4$.

9. The method of claim 7, wherein the tungsten-containing metal film comprises tungsten, tungsten nitride of a low nitrogen concentration (WNx, 0<x≤0.1), tungsten carbide of a low carbon concentration (WCx, 0<x≤0.10), tungsten carbide of a high carbon concentration (WCy, y>0.1), tungsten carbonitride of any carbon and nitrogen concentration (WCN).

10. The method of claim 1, wherein reducing or eliminating oxidation further comprises depositing a capping layer upon the metal layer.

11. The method of claim 10, wherein the capping layer is TiN, TaN, TiSiN, TiAlC, or combinations thereof.

12. The method of claim 1, wherein the width of the plurality of trenches is between 5 to 10 nanometers.

13. A method of fabrication on a substrate, comprising:
depositing a fully-formed tungsten-containing metal film having a first surface and a predetermined first thickness upon a substrate and within a plurality of trenches, wherein the plurality of trenches comprise a predetermined depth, and a width of less than 20 nanometers, and wherein the predetermined first thickness is substantially uniform throughout the plurality of trenches; and
contacting the deposited metal film with a reducing agent such that the predetermined first thickness does not substantially change to a second thickness when the first surface is contacted with oxygen.

14. The method of claim 13, wherein the plurality of trenches comprises trenches with an aspect ratio, depth to width, between about of about 5:1 and about 20:1.

15. The method of claim 13, wherein the reducing agent is halide type metal precursor to provide a metal halide at the first surface or a silane precursor.

16. The method of claim 15, wherein the halide type metal precursor is $TiCl_4$, $TaCl_4$, and combinations thereof.

17. The method of claim 13, wherein the tungsten film comprises nitride containing tungsten products.

18. The method of claim 13, wherein depositing a tungsten film further comprises depositing a capping layer upon the metal layer.

19. A method of fabrication on a substrate, comprising:
depositing a fully-formed tungsten-containing metal film having a first surface and a predetermined first thickness upon a substrate and within a plurality of trenches, wherein the plurality of trenches comprise a predetermined depth, and a width of less than 20 nanometers;
contacting the first surface with a halide type metal precursor; and
contacting the first surface with oxygen, wherein the predetermined first thickness does not substantially change to a second thickness upon contact with oxygen.

20. The method of claim 19, wherein the halide type metal precursor is one of $TiCl_4$, $TaCl_4$, and combinations thereof and wherein the plurality of trenches comprises trenches with an aspect ratio, depth to width, between about of about 5:1 and about 20:1.

* * * * *

UNITED STATES PATENT AND TRADEMARK OFFICE
CERTIFICATE OF CORRECTION

PATENT NO. : 10,879,081 B2  
APPLICATION NO. : 16/196056  
DATED : December 29, 2020  
INVENTOR(S) : Jian et al.

Page 1 of 1

It is certified that error appears in the above-identified patent and that said Letters Patent is hereby corrected as shown below:

In the Claims

Column 11, Line 54, in Claim 2, delete "with," and substitute therefore "with"

Signed and Sealed this
Twenty-sixth Day of January, 2021

Drew Hirshfeld
*Performing the Functions and Duties of the*
*Under Secretary of Commerce for Intellectual Property and*
*Director of the United States Patent and Trademark Office*